(12) United States Patent
Beffa (10) Patent No.: US 6,944,567 B2
(45) Date of Patent: *Sep. 13, 2005

(54) METHOD IN AN INTEGRATED CIRCUIT (IC) MANUFACTURING PROCESS FOR IDENTIFYING AND REDIRECTING ICS MIS-PROCESSED DURING THEIR MANUFACTURE

(75) Inventor: Raymond J. Beffa, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/600,148

(22) Filed: Jun. 19, 2003

(65) Prior Publication Data

US 2004/0024551 A1 Feb. 5, 2004

Related U.S. Application Data

(63) Continuation of application No. 10/067,728, filed on Feb. 4, 2002, now Pat. No. 6,594,611, which is a continuation of application No. 09/793,938, filed on Feb. 27, 2001, now Pat. No. 6,363,329, which is a continuation of application No. 09/537,839, filed on Mar. 29, 2000, now Pat. No. 6,208,947, which is a continuation of application No. 09/302,338, filed on Apr. 29, 1999, now Pat. No. 6,067,507, which is a continuation of application No. 08/806,442, filed on Feb. 26, 1997, now Pat. No. 5,915,231.

(51) Int. Cl.[7] .................... G06F 19/00; G06G 7/6466

(52) U.S. Cl. .................... 702/119; 702/118; 702/82; 700/116; 700/224; 700/226

(58) Field of Search .................... 702/118, 119, 702/117, 81, 82, 87, 84; 700/224, 226, 116, 95, 109, 115, 117; 438/5, 10, 14, 16, 17; 209/573, 571

(56) References Cited

U.S. PATENT DOCUMENTS

| 4,032,949 A | 6/1977 | Bierig |
| 4,455,495 A | 6/1984 | Masuhara et al. |
| 4,510,673 A | 4/1985 | Shils et al. |
| 4,534,014 A | 8/1985 | Ames |
| 4,667,403 A | 5/1987 | Edinger et al. |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 5,003,251 A | 3/1991 | Fuoco |
| 5,103,166 A | 4/1992 | Jeon et al. |

(Continued)

FOREIGN PATENT DOCUMENTS

| JP | 58050728 A | 3/1983 |
| JP | 58060529 A | 4/1983 |
| JP | 61120433 A | 6/1986 |
| JP | 05013529 A | 1/1993 |
| JP | 05-074909 | 3/1993 |
| JP | 10104315 A | 4/1998 |
| SU | 1151333 A | 4/1985 |

*Primary Examiner*—Patrick Assouad
(74) *Attorney, Agent, or Firm*—TraskBritt (57) ABSTRACT

A method of manufacturing IC devices from semiconductor wafers includes providing the wafers and fabricating ICs on the wafers. At probe, a unique fuse ID is stored in each IC, and an electronic wafer map is electronically stored for each wafer indicating the locations of good and bad ICs on the wafer and the fuse IDs of the ICs on the wafer. Each IC is then separated from its wafer to form an IC die, and the IC dice are assembled into IC devices. At the opens/shorts test at the end of assembly, the fuse ID of each IC in each device is automatically retrieved so the wafer map of the IC device may be accessed and evaluated to identify any IC devices containing bad ICs that have accidentally been assembled into IC devices. Any "bad" IC devices are discarded while remaining IC devices continue on to back-end testing.

19 Claims, 2 Drawing Sheets

U.S. PATENT DOCUMENTS

| | | | | |
|---|---|---|---|---|
| 5,105,362 | A | 4/1992 | Kotani | |
| 5,110,754 | A | 5/1992 | Lowrey et al. | |
| 5,217,834 | A | 6/1993 | Higaki | |
| 5,219,765 | A | 6/1993 | Yoshida et al. | |
| 5,226,118 | A | 7/1993 | Baker et al. | |
| 5,235,550 | A | 8/1993 | Zagar | |
| 5,253,208 | A | 10/1993 | Kang | |
| 5,256,562 | A | 10/1993 | Vu et al. | |
| 5,256,578 | A | 10/1993 | Corley et al. | |
| 5,271,796 | A | 12/1993 | Miyashita et al. | |
| 5,289,113 | A | 2/1994 | Meaney et al. | |
| 5,294,812 | A | 3/1994 | Hashimoto et al. | |
| 5,296,402 | A | 3/1994 | Ryou | |
| 5,301,143 | A | 4/1994 | Ohri et al. | |
| 5,326,709 | A | 7/1994 | Moon et al. | |
| 5,345,110 | A | 9/1994 | Renfro et al. | |
| 5,352,945 | A | 10/1994 | Casper et al. | |
| 5,355,320 | A | 10/1994 | Erjavic et al. | |
| 5,420,796 | A | 5/1995 | Weling et al. | |
| 5,424,652 | A | 6/1995 | Hembree et al. | |
| 5,428,311 | A | 6/1995 | McClure | |
| 5,440,240 | A | 8/1995 | Wood et al. | |
| 5,440,493 | A | 8/1995 | Doida | |
| 5,442,561 | A | 8/1995 | Yoshizawa et al. | |
| 5,450,326 | A | 9/1995 | Black | |
| 5,467,304 | A | 11/1995 | Uchida et al. | |
| 5,477,493 | A | 12/1995 | Danbayashi | |
| 5,483,175 | A | 1/1996 | Ahmad et al. | |
| 5,495,417 | A | 2/1996 | Fuduka et al. | |
| 5,504,369 | A | 4/1996 | Dasse et al. | |
| 5,511,005 | A | 4/1996 | Abbe et al. | |
| 5,516,028 | A | 5/1996 | Rasp et al. | |
| 5,537,325 | A | 7/1996 | Iwakiri et al. | |
| 5,538,141 | A | 7/1996 | Gross, Jr. et al. | |
| 5,539,235 | A | 7/1996 | Allee | |
| 5,563,832 | A | 10/1996 | Kagami | |
| 5,568,408 | A | 10/1996 | Maeda | |
| 5,570,293 | A | 10/1996 | Tanaka et al. | |
| 5,581,510 | A | 12/1996 | Furusho et al. | |
| 5,590,069 | A | 12/1996 | Levin | |
| 5,600,171 | A | 2/1997 | Makihara et al. | |
| 5,603,412 | A | 2/1997 | Gross, Jr. et al. | |
| 5,606,193 | A | 2/1997 | Ueda et al. | |
| 5,617,366 | A | 4/1997 | Yoo | |
| 5,619,469 | A | 4/1997 | Joo | |
| 5,625,816 | A | 4/1997 | Burdick et al. | |
| 5,642,307 | A | 6/1997 | Jernigan | |
| 5,726,074 | A | 3/1998 | Yabe | |
| 5,764,650 | A * | 6/1998 | Debenham | 714/704 |
| 5,787,190 | A | 7/1998 | Peng et al. | |
| 5,801,965 | A | 9/1998 | Takagi et al. | |
| 5,828,778 | A | 10/1998 | Hagi et al. | |
| 5,844,803 | A | 12/1998 | Beffa | |
| 5,856,923 | A | 1/1999 | Jones et al. | |
| 5,865,319 | A | 2/1999 | Okuda et al. | |
| 5,867,505 | A | 2/1999 | Beffa | |
| 5,889,674 | A | 3/1999 | Burdick et al. | |
| 5,895,962 | A | 4/1999 | Zheng et al. | |
| 5,907,492 | A | 5/1999 | Akram et al. | |
| 5,915,231 | A | 6/1999 | Beffa | |
| 5,927,512 | A | 7/1999 | Beffa | |
| 5,963,881 | A | 10/1999 | Kahn et al. | |
| 5,991,699 | A | 11/1999 | Kulkarni et al. | |
| 6,000,830 | A | 12/1999 | Asano et al. | |
| 6,018,686 | A | 1/2000 | Orso et al. | |
| 6,049,624 | A | 4/2000 | Wilson et al. | |
| 6,055,463 | A | 4/2000 | Cheong et al. | |
| 6,067,507 | A | 5/2000 | Beffa | |
| 6,072,574 | A | 6/2000 | Zeimantz | |
| 6,075,216 | A | 6/2000 | Nakamura et al. | |
| 6,100,486 | A | 8/2000 | Beffa | |
| 6,122,563 | A | 9/2000 | Beffa | |
| 6,130,442 | A | 10/2000 | Di Zenzo et al. | |
| 6,138,256 | A * | 10/2000 | Debenham | 714/724 |
| 6,147,316 | A | 11/2000 | Beffa | |
| 6,148,307 | A | 11/2000 | Burdick et al. | |
| 6,190,972 | B1 | 2/2001 | Zheng et al. | |
| 6,194,738 | B1 | 2/2001 | Debenham et al. | |
| 6,208,947 | B1 | 3/2001 | Beffa | |
| 6,219,810 | B1 * | 4/2001 | Debenham | 714/724 |
| 6,226,394 | B1 * | 5/2001 | Wilson et al. | 382/145 |
| 6,259,520 | B1 | 7/2001 | Zeimantz | |
| 6,307,171 | B1 * | 10/2001 | Beffa | 209/573 |
| 6,350,959 | B1 * | 2/2002 | Beffa | 209/573 |
| 6,363,295 | B1 | 3/2002 | Akram et al. | |
| 6,363,329 | B2 | 3/2002 | Beffa | |
| 6,365,421 | B2 | 4/2002 | Debenham et al. | |
| 6,365,860 | B1 | 4/2002 | Beffa | |
| 6,365,861 | B1 * | 4/2002 | Beffa | 209/573 |
| 6,373,011 | B1 * | 4/2002 | Beffa | 209/573 |
| 6,373,566 | B2 | 4/2002 | Zeimantz | |
| 6,400,840 | B2 * | 6/2002 | Wilson et al. | 382/145 |
| 6,427,092 | B1 * | 7/2002 | Jones et al. | 700/121 |
| 6,437,271 | B1 * | 8/2002 | Beffa | 209/573 |
| 6,441,897 | B1 | 8/2002 | Zeimantz | |
| 6,504,123 | B2 * | 1/2003 | Beffa | 209/573 |
| 6,529,793 | B1 | 3/2003 | Beffa | |
| 6,553,276 | B2 * | 4/2003 | Akram et al. | 700/121 |
| 6,588,854 | B2 * | 7/2003 | Wilson et al. | 702/145 |
| 6,594,611 | B2 * | 7/2003 | Beffa | 702/119 |
| 6,636,068 | B2 | 10/2003 | Farnworth et al. | |
| 6,703,573 | B2 | 3/2004 | Beffa | |
| 6,788,993 | B2 | 9/2004 | Beffa | |

* cited by examiner

METHOD IN AN INTEGRATED CIRCUIT (IC) MANUFACTURING PROCESS FOR IDENTIFYING AND REDIRECTING ICS MIS-PROCESSED DURING THEIR MANUFACTURE

CROSS-REFERENCE TO RELATED APPLICATIONS

This application is a continuation of application Ser. No. 10/067,728, filed Feb. 4, 2002, now U.S. Pat. No. 6,594,611, issued July 15, 2003, which is a continuation of application Ser. No. 09/793,938, filed Feb. 27, 2001, now U.S. Pat. No. 6,363,329, issued Mar. 26, 2002, which is a continuation of application Ser. No. 09/537,839, filed Mar. 29, 2000, now U.S. Pat. No. 6,208,947, issued Mar. 27, 2001, which is a continuation of application Ser. No. 09/302,338, filed Apr. 29, 1999, now U.S. Pat. No. 6,067,507, issued May 23, 2000, which is a continuation of application Ser. No. 08/806,442, filed Feb. 26, 1997, now U.S. Pat. No. 5,915,231, issued Jun. 22, 1999, which is related to: Ser. No. 08/591,238, filed Jan. 17, 1996, now abandoned; Ser. No. 08/664,109, filed Jun. 13, 1996, now U.S. Pat. No. 5,895,962, issued Apr. 20, 1999; and Ser. No. 08/785,353, filed Jan. 17, 1997 now U.S. Pat. No. 5,927,512, issued Jul. 27, 1999.

BACKGROUND OF THE INVENTION

1. Field of the Invention

The present invention relates in general to integrated circuit (IC) manufacturing and, more specifically, to methods in IC manufacturing processes for identifying and redirecting ICs mis-processed during their manufacture.

2. State of the Art

Figure 1:
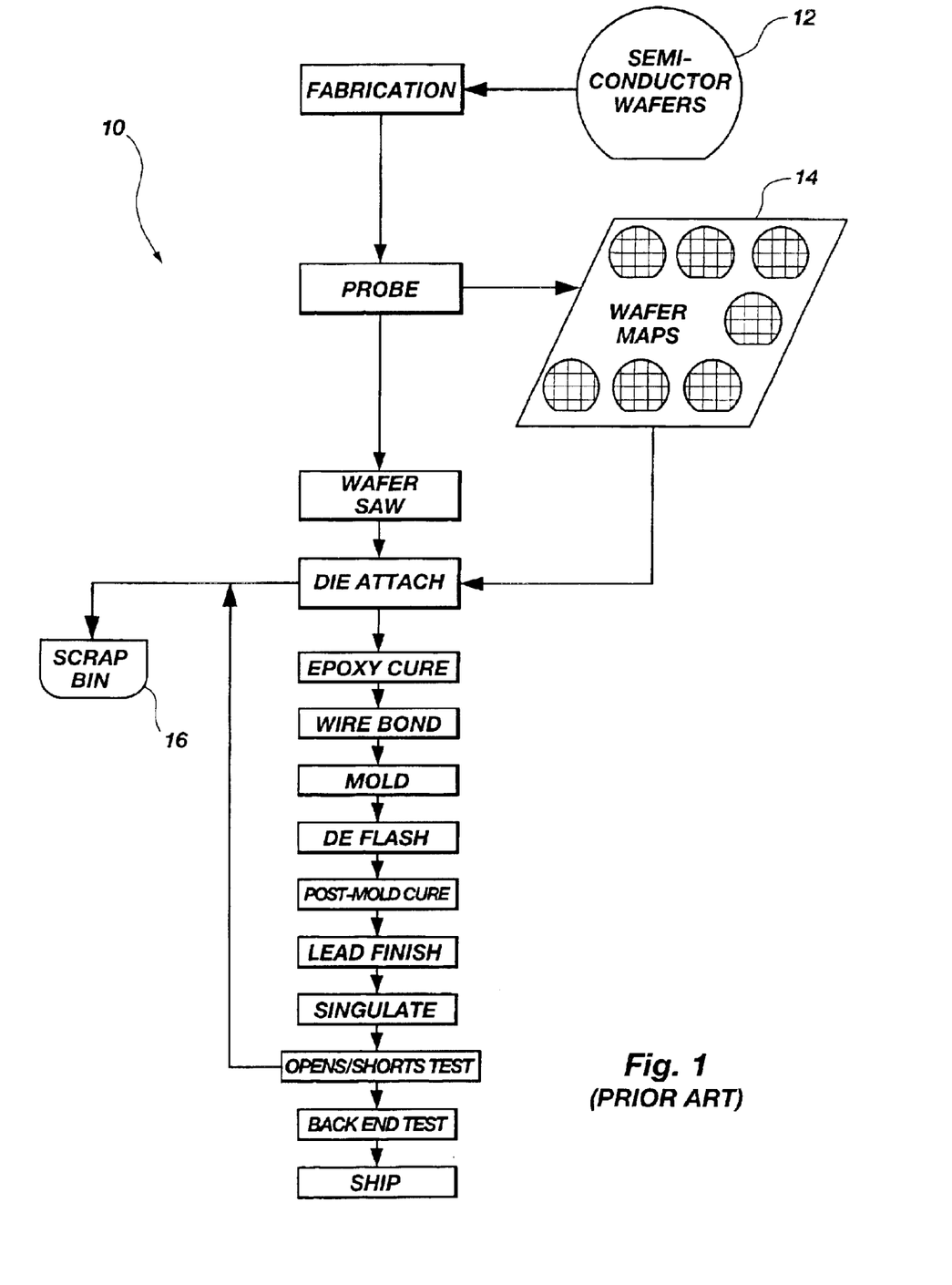
FIG. 1 is a flow diagram illustrating a conventional integrated circuit (IC) manufacturing process.

As shown in FIG. 1, a typical process 10 for manufacturing very small electronic circuits referred to as "Integrated Circuits" (ICs) begins with the ICs being formed or "fabricated" on the surface of a wafer 12 of semiconductor material, such as silicon. Once fabricated, ICs are electronically probed to determine whether they are functional (i.e., "good") or nonfunctional (i.e., "bad"), and a computer then stores an electronic wafer map 14 of the wafer 12 identifying the locations of the good and bad ICs on the wafer 12.

After being probed, ICs are sawed from their wafer 12 into discrete IC dice or "chips" using high-speed precision dicing equipment. IC dice identified as good by their wafer map 14 are then each "picked" by automated equipment from their sawed wafer 12 and "placed" on an epoxy coated bonding site of a lead frame, while IC dice identified as bad are discarded into a scrap bin 16. The epoxy attaching the good IC dice to their lead frames is then allowed to cure, and the attached dice are wire bonded to their lead frames using high speed bonding equipment. At this point in the process 10, the lead frames of IC dice are still connected to other lead frames.

Once wire bonded, IC dice and their lead frames are formed into IC packages using a hot thermosetting plastic encapsulant injected into a mold. Leads of the lead frames project from the IC packages after encapsulation, and these leads are dipped in a cleansing chemical bath in a process referred to as "de-flash." After de-flash, IC packages are cured to set their plastic encapsulant, and their projecting leads are then electroplated with a lead/tin finish.

After lead finishing, connections between the lead frames of different IC packages are cut to "singulate" the IC packages into discrete IC devices. Discrete devices are then tested in a simple electronic test that checks for "opens" (i.e., no connection) within the devices where connections should exist and "shorts" (i.e., a connection) where connections should not exist. Devices that fail the opens/shorts test are discarded into the scrap bin 16, and devices that pass proceed to extensive back-end test procedures where they are tested for functionality and operability before being shipped to customers.

On occasion, bad IC dice are accidentally picked from a sawed wafer 12 for subsequent assembly and back-end testing as described above. This can happen, for example, because a human, software, or electronic error causes the automated pick and place equipment described above to access the wrong wafer map 14 for a wafer 12. It can also happen because of a misalignment, referred to as a "registration" error, between the automated pick and place equipment and a wafer 12. In either case, such accidents typically are not detected until the bad IC dice undergo at least some back-end testing and, as a result, waste back-end testing resources. Therefore, there is a need in the art for a method of identifying and discarding accidentally assembled IC dice before the dice undergo back-end testing procedures.

As described in U.S. Pat. Nos. 5,301,143, 5,294,812, and 5,103,166, some methods have been devised to electronically identify IC dice. Such methods take place "off" the manufacturing line, and involve the use of electrically retrievable identification (ID) codes, such as so-called "fuse IDs," programmed into individual IC dice to identify the dice. The programming of a fuse ID typically involves selectively blowing an arrangement of fuses or anti-fuses in an IC die so that when the fuses or anti-fuses are accessed, they output a selected ID code. Unfortunately, none of these methods addresses the problem of identifying and discarding accidentally assembled IC dice "on" a manufacturing line.

BRIEF SUMMARY OF THE INVENTION

The present invention provides a method that can identify and discard accidentally assembled integrated circuit (IC) dice "on" an IC manufacturing line before the dice undergo back-end testing procedures.

In one embodiment, the method identifies and redirects ICs that have been mis-processed, such as bad ICs identified at probe that have accidentally been assembled and packaged. The method includes storing data, such as an electronic wafer map, at probe, for example, in association with a unique identification (ID) code, such as a fuse ID, of each of the ICs. The stored data indicates a process flow within the IC manufacturing process that each of the ICs should undergo. For example, the stored data may indicate that an IC is bad and should be discarded, or that an IC is good and should be assembled and packaged.

As described above, on occasion, one or more ICs do not undergo the process flow they should undergo. For example, some bad ICs may proceed through assembly and packaging rather than being discarded. To check for ICs that have not undergone the process flow they should undergo, the present method also includes reading the ID code of each of the ICs at, for example, the opens/shorts test at the end of assembly. The data (e.g., the wafer map) stored in association with the ID code of each of the ICs is then accessed and evaluated to identify any ICs that have undergone a process flow within the IC manufacturing process that is different from the process flow their data indicates they should have undergone, such as bad ICs that have proceeded through assembly and packaging. Any ICs identified as having been mis-processed are then redirected within the IC manufacturing process. Thus, for example, bad ICs that have been assembled and packaged may be discarded so they do not proceed to back-end testing.

In another embodiment of the present invention, a method of manufacturing IC devices, such as Dynamic Random Access Memory Devices (DRAMs), from semiconductor wafers includes providing the semiconductor wafers and fabricating ICs on the wafers. A substantially unique ID code, such as a fuse ID, is then stored in each of the ICs, and data is stored in association with the ID code of each of the ICs that indicates a manufacturing process flow that each of the ICs should undergo. Each IC is then separated from its wafer to form an IC die, and the IC dice are assembled into IC devices, such as wire bond/lead frame devices, Chip On Board (COB) devices, or flip-chip devices. The ID code associated with each of the IC devices is then read, and the data stored in association with the ID code associated with each of the IC devices is accessed and evaluated to identify any IC devices that have undergone a manufacturing process flow that is different from the manufacturing process flow their data indicates they should have undergone. These identified IC devices are then redirected (e.g., discarded), and the remaining IC devices continue on to back-end testing.

A further embodiment of the present invention comprises a method of manufacturing Multi-Chip Modules (MCMs) similar to the method of manufacturing IC devices described above.

A still further embodiment of the present invention comprises another method of manufacturing IC devices from semiconductor wafers. The method includes providing the semiconductor wafers and fabricating ICs on the wafers. Each IC is electronically probed to identify good and bad ICs on the wafers and then programmed with a unique fuse ID. An electronic wafer map is stored for each wafer indicating the locations of good and bad ICs on the wafer and associating each IC on the wafer with its fuse ID. Each IC is then sawed from its wafer to form a discrete IC die that is automatically picked and placed on an epoxy coated bonding site of a lead frame. The epoxy is allowed to cure, and the IC dice are then wire bonded to their respective lead frames. Next, the IC dice and their associated lead frames are injection molded to form IC packages. Projecting leads of the packages are then de-flashed, the packages are cured, and the leads are then electroplated. Then, each package is singulated to form a discrete IC device, and each device is tested for opens and shorts. The fuse ID associated with each IC device is then electrically retrieved so the wafer map stored in association with the fuse ID associated with each of the IC devices may be accessed and evaluated to identify any IC devices that include a bad IC and any IC devices that include a good IC. Any IC devices identified as including a bad IC are discarded, and any IC devices identified as including a good IC proceed to back-end testing.

DETAILED DESCRIPTION OF THE INVENTION

Figure 2:
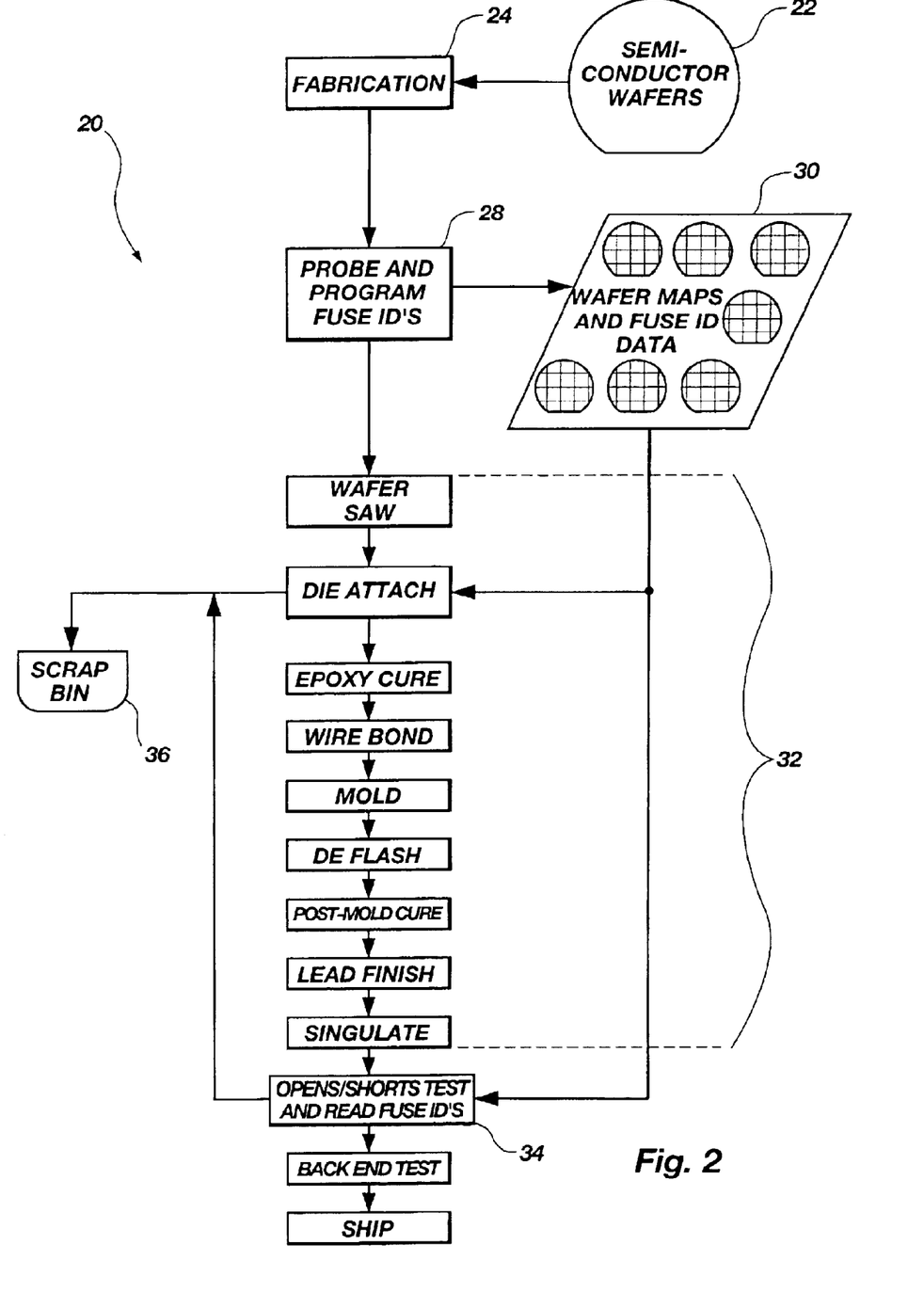
FIG. 2 is a flow diagram illustrating an IC manufacturing process in which accidentally assembled IC dice are identified and discarded in accordance with the present invention before back-end testing.

As shown in FIG. 2, an inventive method 20 for manufacturing integrated circuits (ICs) from a group of semiconductor wafers 22 includes the step 24 of fabricating the ICs on the wafers 22. It will be understood by those having skill in the field of this invention that the present invention is applicable to any IC devices, including Dynamic Random Access Memory (DRAM) ICs, Static Random Access Memory (SRAM) ICs, Synchronous DRAM (SDRAM) ICs, processor ICs, Single In-line Memory Modules (SIMMs), Dual In-line Memory Modules (DIMMs), and other Multi-Chip Modules (MCMs). It will also be understood that although the present invention will be described below in the context of a wire bond/lead frame assembly process, the present invention is applicable to any IC assembly process, including, for example, Chip On Board (COB), flip chip, and Tape-Automated Bonding (TAB) processes.

After fabrication, the ICs are electronically probed in a probe step 28 to evaluate a variety of their electronic characteristics, and data from the probe step 28 identifying bad and good ICs are noted and stored as wafer maps 30, as described above. During the probe step 28, ICs fabricated on the wafers 22 are programmed in the manner described above with a fuse identification (ID) unique to each IC. The fuse ID for each IC is then stored in association with the wafer maps 30 such that each die location on each wafer map 30 is associated with the unique fuse ID of a particular IC. The fuse ID may identify, for example, a wafer lot ID, the week the ICs were fabricated, a wafer ID, a die location on the wafer, and a fabrication facility ID.

It will be understood, of course, that the present invention includes within its scope ICs having any ID code, including those having fuse IDs. It will also be understood that the ICs may be programmed with their fuse IDs at steps in the manufacturing process of inventive method 20 other than the probe step 28.

Once programmed, the ICs proceed through an assembly process 32 to an opens/shorts test 34 as described above. At the opens/shorts test 34, the fuse ID of each IC is automatically read and correlated with the wafer map 30 of its wafer 22. If a bad IC has accidentally proceeded through the assembly process 32, the fuse ID of the IC, in correlation with the wafer map 30 of the ICs wafer 22, will identify the IC as a bad IC so it can be discarded to a scrap bin 36 instead of proceeding through back-end testing. The present invention thus provides a method of identifying and discarding accidentally assembled ICs before they undergo back-end testing.

It should be understood that although the fuse IDs of ICs in the process of inventive method 20 are typically read electronically, they may also be read optically if the fuse IDs consist of "blown" laser fuses that are optically accessible. It should also be understood that the present invention includes within its scope any method in an IC manufacturing process for identifying and redirecting ICs mis-processed during their manufacture using ID codes such as fuse IDs.

Although the present invention has been described with reference to a preferred embodiment, the invention is not limited to this embodiment. For example, while the various steps of the preferred embodiment have been described as occurring in a particular order, it will be understood that these steps need not necessarily occur in the described order to fall within the scope of the present invention. Thus, the invention is limited only by the appended claims, which include within their scope all equivalent methods that operate according to the principles of the invention as described.

What is claimed is:

1. A manufacturing process having data for integrated circuit devices comprising:

storing data and a substantially unique identification code of each integrated circuit device of the integrated circuit devices at one of at probe testing of the integrated circuit devices and after probe testing of the integrated circuit devices, the data indicating a process flow within the manufacturing process for each integrated circuit device of the integrated circuit devices, storing data comprising:
  storing the substantially unique identification code of each integrated circuit device of the integrated circuit devices and a die location on an electronically stored wafer map for each integrated circuit device of the integrated circuit devices;
reading the substantially unique identification code of each integrated circuit device of the integrated circuit devices;
evaluating the data for each integrated circuit device of the integrated circuit devices to the data for manufacturing process data stored for each integrated circuit device of the integrated circuit devices;
identifying integrated circuit devices having a process flow within the manufacturing process different from the process flow of the data stored of each integrated circuit device of the integrated circuit devices; and
directing each integrated circuit device of the integrated circuit devices identified as having a process flow within the manufacturing process different from the process flow of the data stored of each integrated circuit device of the integrated circuit devices to another process.

2. The process of claim 1, wherein storing data comprises storing data at a probe.

3. The process of claim 1, wherein storing data comprises storing data and the substantially unique identification code of each integrated circuit device of the integrated circuit devices to indicate each integrated circuit device of the integrated circuit devices comprises one of a good integrated circuit device and a bad integrated circuit device.

4. The process of claim 1, wherein reading the substantially unique identification code of each integrated circuit device of the integrated circuit devices comprises electrically retrieving a unique fuse identification programmed into each integrated circuit device of the integrated circuit devices.

5. The process of claim 1, wherein reading the substantially unique identification code of each integrated circuit device of the integrated circuit devices comprises optically reading a unique identification code on each integrated circuit device of the integrated circuit devices.

6. The process of claim 5, wherein optically reading the unique identification code on each integrated circuit device of the integrated circuit devices comprises optically reading a unique laser fuse identification programmed into each integrated circuit device of the integrated circuit devices.

7. The process of claim 1, wherein reading the substantially unique identification code of each integrated circuit device of the integrated circuit devices comprises reading the substantially unique identification code of each integrated circuit device of the integrated circuit devices at an opens/shorts test in the manufacturing process.

8. The process of claim 1, wherein the stored data and the substantially unique identification code of each integrated circuit device of the integrated circuit devices are accessed by accessing the stored data and the substantially unique identification code of each integrated circuit device of the integrated circuit devices at an opens/shorts test in the manufacturing process.

9. The process of claim 8, wherein evaluating the data comprises evaluating the data for each integrated circuit device of the integrated circuit devices to identify any bad integrated circuit devices having undergone an assembly procedure within the manufacturing process.

10. The process of claim 9, wherein evaluating the data comprises evaluating the data at an opens/shorts test in the manufacturing process.

11. The process of claim 1, wherein directing each integrated circuit device of the integrated circuit devices identified as having a process flow within the manufacturing process different from the process flow of the stored data of each integrated circuit device of the integrated circuit devices to another process comprises discarding any integrated circuit device identified as having a process flow within the manufacturing process different from the process flow of the stored data.

12. The process of claim 1, wherein directing occurs before a back-end test procedure within the manufacturing process.

13. The process of claim 1, further comprising assembling each integrated circuit device of the integrated circuit devices into packaged integrated circuit devices after storing data and before reading the substantially unique identification code of each integrated circuit device of the integrated circuit devices.

14. A method of manufacturing integrated circuit devices comprising:
  providing a plurality of semiconductor wafers, each semiconductor wafer having a plurality of integrated circuit devices thereon, the integrated circuit devices comprising:
    integrated circuit devices selected from a group comprising Dynamic Random Access Memory (DRAM) devices, Static Random Access Memory (SRAM) devices, synchronous DRAM (SDRAM) devices, and processor devices;
  storing a substantially unique identification code in each integrated circuit device of the plurality of integrated circuit devices on each semiconductor wafer of the plurality of semiconductor wafers;
  storing data and the substantially unique identification code of each integrated circuit device of the plurality of integrated circuit devices indicating manufacturing processes for each integrated circuit device of the plurality of integrated circuit devices at one of probe testing and after probe testing of the plurality of integrated circuit devices;
  separating each integrated circuit device of the plurality of integrated circuit devices on each semiconductor wafer of the plurality of semiconductor wafers to form an integrated circuit device of a plurality of integrated circuit devices;
  assembling each integrated circuit device of the plurality of integrated circuit devices into an integrated circuit device assembly;
  reading the substantially unique identification code of each integrated circuit device of the integrated circuit device assemblies;
  evaluating data for each integrated circuit device of the plurality of integrated circuit devices of the integrated circuit device assemblies identifying any integrated circuit devices having undergone any manufacturing process different from the indicated manufacturing processes of the stored data for each integrated circuit device of the plurality of integrated circuit devices;

subjecting to further processing the integrated circuit devices of the plurality of integrated circuit devices identified as having undergone a manufacturing process different from the indicated manufacturing processes of its stored data; and back-end testing integrated circuit devices not subjected to further processing.

15. The method of claim 14, further comprising programming each integrated circuit device of the plurality of integrated circuit devices on each semiconductor wafer of the plurality of semiconductor wafers to permanently store a unique fuse identification.

16. The method of claim 15, wherein programming each integrated circuit device of the plurality of integrated circuit devices on each semiconductor wafer of the plurality of semiconductor wafers to permanently store the unique fuse identification comprises programming at least one of fuses and anti-fuses in each integrated circuit device of the plurality of integrated circuit devices on each semiconductor wafer of the plurality of semiconductor wafers to permanently store the unique fuse identification.

17. The method of claim 14, wherein assembling each integrated circuit device of the plurality of integrated circuit devices into an integrated circuit device assembly comprises:

picking each integrated circuit device of the plurality of integrated circuit devices from its semiconductor wafer of the plurality of semiconductor wafers;

placing each integrated circuit device of the plurality of integrated circuit devices onto an epoxy-coated bonding site of one of a plurality of lead frames;

curing the epoxy on the bonding site of each one of the plurality of lead frames;

wire bonding each integrated circuit device of the plurality of integrated circuit devices to its associated lead frame;

injection molding each integrated circuit device of the plurality of integrated circuit devices and the associated lead frame to form one of a plurality of integrated circuit device packages, each having projecting leads;

deflashing the projecting leads of each integrated circuit device package of the plurality of integrated circuit device packages;

curing each integrated circuit device package of the plurality of integrated circuit device packages;

electroplating the projecting leads of each integrated circuit device package of the plurality of integrated circuit device packages;

singulating each integrated circuit device package of the plurality of integrated circuit device packages into one of a plurality of discrete integrated circuit devices; and testing each discrete integrated circuit device of the plurality of discrete integrated circuit devices for opens and shorts.

18. The method of claim 14, wherein assembling each integrated circuit device of the plurality of integrated circuit devices into an integrated circuit device assembly comprises assembling each integrated circuit device of the plurality of integrated circuit devices into an integrated circuit device selected from a group comprising a wire bond/lead frame integrated circuit device, a Chip-On-Board (COB) integrated circuit device, a flip-chip integrated circuit device, and a Tape-Automated Bonding (TAB) integrated circuit device.

19. A method of manufacturing Multi-Chip Modules comprising:

providing a plurality of integrated circuit devices on a semiconductor wafer of a plurality of semiconductor wafers;

storing a substantially unique identification code in each integrated circuit device of the plurality of integrated circuit devices on each semiconductor wafer of the plurality of semiconductor wafers at one of probe testing and after probe testing;

storing data and the substantially unique identification code of each integrated circuit device of the plurality of integrated circuit devices indicating desired manufacturing processes for each integrated circuit device of the plurality of integrated circuit devices;

separating each integrated circuit device of the plurality of integrated circuit devices on each semiconductor wafer of a plurality of semiconductor wafers from each semiconductor wafer to form one of a plurality of integrated circuit devices;

assembling one or more integrated circuit devices of the plurality of integrated circuit devices into each of a plurality of multi-chip modules, the plurality of multi-chip modules selected from a group comprising Single In-Line Memory Modules (SIMMs) and Dual In-line Memory Modules (DIMMs);

reading the substantially unique identification code of each integrated circuit device of the plurality of integrated circuit devices in each of the plurality of multi-chip modules;

evaluating data for each integrated circuit device of the plurality of integrated circuit devices in each of the plurality of multi-chip modules identifying any multi-chip modules having integrated circuit devices having undergone a manufacturing process that is different from the desired manufacturing processes;

redirecting any multi-chip modules identified as having integrated circuit devices having undergone the manufacturing process that is different from the desired manufacturing processes; and back-end testing any nonredirected multi-chip modules.

* * * * *

UNITED STATES PATENT AND TRADEMARK OFFICE
CERTIFICATE OF CORRECTION

PATENT NO. : 6,944,567 B2
APPLICATION NO. : 10/600148
DATED : September 13, 2005
INVENTOR(S) : Raymond J. Beffa It is certified that error appears in the above-identified patent and that said Letters Patent is hereby corrected as shown below:

On the title page:
In ITEM (54) "Title," LINE 3, change "ICS" to --ICs--

In the drawings:
In FIG. 2, at the reference numeral "28" change "IC'S" to --ICs--
at the reference numeral "34" change "IC'S" to --ICs--

In the specification:
COLUMN 1, LINE 3, change "ICS" to --ICs--

UNITED STATES PATENT AND TRADEMARK OFFICE
CERTIFICATE OF CORRECTION

PATENT NO. : 6,944,567 B2 Page 2 of 3
APPLICATION NO. : 10/600148
DATED : September 13, 2005
INVENTOR(S) : Raymond J. Beffa

It is certified that error appears in the above-identified patent and that said Letters Patent is hereby corrected as shown below:

Title page
Replace FIG. 2 with the following Fig. 2

Signed and Sealed this

Sixth Day of November, 2007

JON W. DUDAS
*Director of the United States Patent and Trademark Office*

(12) United States Patent
Beffa (10) Patent No.: US 6,944,567 B2
(45) Date of Patent: *Sep. 13, 2005

(54) METHOD IN AN INTEGRATED CIRCUIT (IC) MANUFACTURING PROCESS FOR IDENTIFYING AND REDIRECTING ICS MIS-PROCESSED DURING THEIR MANUFACTURE

(75) Inventor: Raymond J. Beffa, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 10/600,148

(22) Filed: Jun. 19, 2003

(65) Prior Publication Data
US 2004/0024551 A1 Feb. 5, 2004

Related U.S. Application Data

(63) Continuation of application No. 10/067,728, filed on Feb. 4, 2002, now Pat. No. 6,594,611, which is a continuation of application No. 09/793,938, filed on Feb. 27, 2001, now Pat. No. 6,363,329, which is a continuation of application No. 09/537,839, filed on Mar. 29, 2000, now Pat. No. 6,208,947, which is a continuation of application No. 09/302,338, filed on Apr. 29, 1999, now Pat. No. 6,067,507, which is a continuation of application No. 08/806,442, filed on Feb. 26, 1997, now Pat. No. 5,915,231.

(51) Int. Cl.[7] ............ G06F 19/00; G06G 7/6466

(52) U.S. Cl. ............ 702/119; 702/118; 702/82; 700/116; 700/224; 700/226

(58) Field of Search ............ 702/118, 119, 702/117, 81, 82, 87, 84; 700/224, 226, 116, 95, 109, 115, 117; 438/5, 10, 14, 16, 17; 209/573, 571

(56) References Cited

U.S. PATENT DOCUMENTS

| | | |
|---|---|---|
| 4,032,949 A | 6/1977 | Bierig |
| 4,455,495 A | 6/1984 | Masuhara et al. |
| 4,510,673 A | 4/1985 | Shils et al. |
| 4,534,014 A | 8/1985 | Ames |
| 4,667,403 A | 5/1987 | Edinger et al. |
| 4,871,963 A | 10/1989 | Cozzi |
| 4,954,453 A | 9/1990 | Venutolo |
| 4,958,373 A | 9/1990 | Usami et al. |
| 4,967,381 A | 10/1990 | Lane et al. |
| 5,003,251 A | 3/1991 | Fuoco |
| 5,103,166 A | 4/1992 | Jeon et al. |

(Continued)

FOREIGN PATENT DOCUMENTS

| | | |
|---|---|---|
| JP | 58050728 A | 3/1983 |
| JP | 58060529 A | 4/1983 |
| JP | 61120433 A | 6/1986 |
| JP | 05013529 A | 1/1993 |
| JP | 05-074909 | 3/1993 |
| JP | 10104315 A | 4/1998 |
| SU | 1151333 A | 4/1985 |

*Primary Examiner*—Patrick Assouad
(74) *Attorney, Agent, or Firm*—TraskBritt (57) ABSTRACT

A method of manufacturing IC devices from semiconductor wafers includes providing the wafers and fabricating ICs on the wafers. At probe, a unique fuse ID is stored in each IC, and an electronic wafer map is electronically stored for each wafer indicating the locations of good and bad ICs on the wafer and the fuse IDs of the ICs on the wafer. Each IC is then separated from its wafer to form an IC die, and the IC dice are assembled into IC devices. At the opens/shorts test at the end of assembly, the fuse ID of each IC in each device is automatically retrieved so the wafer map of the IC device may be accessed and evaluated to identify any IC devices containing bad ICs that have accidentally been assembled into IC devices. Any "bad" IC devices are discarded while remaining IC devices continue on to back-end testing.

19 Claims, 2 Drawing Sheets